(12) United States Patent
Lee

(10) Patent No.: US 8,704,250 B2
(45) Date of Patent: Apr. 22, 2014

(54) NITRIDE SEMICONDUCTOR LIGHT EMITTING DEVICE AND FABRICATION METHOD THEREOF

(75) Inventor: Suk Hun Lee, Gwangjoo-si (KR)

(73) Assignee: LG Innotek Co., Ltd., Seoul (KR)

( * ) Notice: Subject to any disclaimer, the term of this patent is extended or adjusted under 35 U.S.C. 154(b) by 473 days.

(21) Appl. No.: 12/981,023

(22) Filed: Dec. 29, 2010

(65) Prior Publication Data

US 2011/0121261 A1 May 26, 2011

Related U.S. Application Data

(63) Continuation of application No. 11/722,658, filed as application No. PCT/KR2005/004119 on Dec. 5, 2005, now Pat. No. 7,902,561.

(30) Foreign Application Priority Data

Dec. 23, 2004 (KR) ........................ 10-2004-0111086

(51) Int. Cl.
  *H01L 33/00* (2010.01)

(52) U.S. Cl.
  USPC ............................................ 257/94; 257/101

(58) Field of Classification Search
  USPC .................................... 257/94, 101
  See application file for complete search history.

(56) References Cited

U.S. PATENT DOCUMENTS

| | | | |
|---|---|---|---|
| 5,932,896 A * | 8/1999 | Sugiura et al. .................. 257/94 |
| 6,078,064 A * | 6/2000 | Ming-Jiunn et al. ........... 257/103 |
| 6,266,355 B1 * | 7/2001 | Sverdlov .................... 372/45.01 |
| 6,388,275 B1 | 5/2002 | Kano |
| 6,627,552 B1 * | 9/2003 | Nishio et al. .................. 438/694 |
| 7,902,561 B2 | 3/2011 | Lee |
| 2002/0080113 A1 | 6/2002 | Kim |
| 2003/0116767 A1 | 6/2003 | Kneissl et al. |
| 2005/0230688 A1 * | 10/2005 | Lee ................................ 257/79 |
| 2006/0027814 A1 | 2/2006 | Watanabe et al. |
| 2006/0175600 A1 * | 8/2006 | Sato et al. ........................ 257/14 |
| 2008/0128678 A1 | 6/2008 | Lee |
| 2008/0149955 A1 | 6/2008 | Nakamura et al. |
| 2011/0121261 A1 | 5/2011 | Lee |

FOREIGN PATENT DOCUMENTS

| | | |
|---|---|---|
| EP | 1221723 | 7/2002 |
| JP | 5-110139 A | 4/1993 |
| JP | 05-291133 | 11/1993 |
| JP | 9-232629 A | 9/1997 |

(Continued)

OTHER PUBLICATIONS

Office Action dated Jul. 13, 2008 in Chinese Application No. 200580041795, filed Dec. 5, 2005.

(Continued)

*Primary Examiner* — Howard Weiss
*Assistant Examiner* — Tifney Skyles
(74) *Attorney, Agent, or Firm* — Saliwanchik, Lloyd & Eisenschenk

(57) ABSTRACT

The present invention relates to a nitride semiconductor light emitting device including: a first nitride semiconductor layer having a super lattice structure of AlGaN/n-GaN or AlGaN/GaN/n-GaN; an active layer formed on the first nitride semiconductor layer to emit light; a second nitride semiconductor layer formed on the active layer; and a third nitride semiconductor layer formed on the second nitride semiconductor layer. According to the present invention, the crystallinity of the active layer is enhanced, and optical power and reliability are also enhanced.

31 Claims, 2 Drawing Sheets

(56) References Cited

FOREIGN PATENT DOCUMENTS

| | | |
|---|---|---|
| JP | 09-293935 | 11/1997 |
| JP | 10-051070 A | 2/1998 |
| JP | 11-068158 A | 3/1999 |
| JP | 11-191639 A | 7/1999 |
| JP | 11-274560 | 10/1999 |
| JP | 11-340509 | 12/1999 |
| JP | 2000-031591 A | 1/2000 |
| JP | 2000-068594 A | 3/2000 |
| JP | 2002-009335 A | 1/2002 |
| JP | 2002-319703 A | 10/2002 |
| JP | 2003-198045 A | 7/2003 |
| JP | 2004-200325 A | 7/2004 |
| JP | 2007-548056 | 7/2008 |
| JP | 2008-526013 A | 7/2008 |
| KR | 10-2002-0053653 A | 7/2002 |
| KR | 10-2007-0079659 A | 10/2002 |
| WO | WO-98/31055 A1 | 7/1998 |
| WO | WO-2004/017431 A1 | 2/2004 |
| WO | WO-2004-047245 A1 | 6/2004 |
| WO | WO-2006-068375 A1 | 6/2006 |

OTHER PUBLICATIONS

Office Action dated Sep. 4, 2012 in Japanese Application No. 2007-548056, filed Dec. 5, 2005.

Office Action dated Jun. 29, 2011 in Japanese Application No. 2007-548056, filed Jun. 22, 2007.

Japanese Appeal Decision of Refusal, dated Feb. 12, 2014 in Japanese Application No. 2012-26015.

* cited by examiner

NITRIDE SEMICONDUCTOR LIGHT EMITTING DEVICE AND FABRICATION METHOD THEREOF

CROSS-REFERENCE TO RELATED APPLICATIONS

This application is a continuation of U.S. application Ser. No. 11/722,658, filed Jun. 22, 2007, which is the U.S. national stage application of International Patent Application No. PCT/KR2005/004119, filed Dec. 5, 2005, which claims priority to Korean Patent Application No. 10-2004-0111086, filed Dec. 23, 2004, all of which are incorporated herein by reference in their entirety.

BACKGROUND

1. Technical Field

The present invention is relative to a nitride semiconductor light emitting device and fabrication method thereof, and to a nitride semiconductor light emitting device and a fabrication method thereof that can enhance the crystallinity of an active layer and the optical power and operation reliability of the light emitting device light output.

2. Background Art

A schematic stack structure of a general nitride semiconductor light emitting device and a fabrication method thereof will now be described.

FIG. 1 is a sectional view of a general nitride semiconductor light emitting device.

Referring to FIG. 1, a conventional nitride semiconductor light emitting device includes a substrate 101, a buffer layer 103, an n-GaN layer 105, an active layer 107 and a p-GaN layer 109.

In detail, in order to minimize the occurrence of crystal defects due to differences in the lattice constants and the thermal expansion coefficients of the substrate 101, for example, sapphire substrate, and the n-GaN layer 105, the buffer layer 103 is formed of a GaN-based nitride or an AlN-based nitride having an amorphous phase at a low temperature. After the buffer layer 103 is formed, the n-GaN layer 105 doped with silicon at a doping concentration of $10^{18}/cm^3$ is formed at a high temperature as a first electrode contact layer. Thereafter, the growth temperature is lowered and the active layer 107 is formed. Thereafter, the growth temperature is again elevated and the p-GaN layer 109 doped with magnesium (Mg) is formed.

The nitride semiconductor light emitting device having the aforementioned stack structure is formed in a p-/n-junction structure which uses the n-GaN layer 105 as the first electrode contact layer and uses the p-GaN layer 109 as the second electrode contact layer.

A second electrode material formed on the second electrode contact layer is limited depending on a doping type of the second electrode contact layer. For example, in order to decrease the contact resistance between the second contact material and the p-GaN layer 109 having a high resistance component and enhance the current spreading, a thin transmissive resistance material of a Ni/Au alloy is used as the second electrode material. The n-GaN layer 105 used as the first electrode contact layer is made in a single crystal structure which has a higher growth temperature than and is thicker than the buffer layer 103 having the amorphous crystallinity. In particular, in the conventional p-/n-junction light emitting device structure, the n-GaN layer 105 used as the first electrode contact layer is doped with Si of $10^{18}/cm^3$-$10^{19}/cm^{3'}$ and is grown in a thickness within 5 μm which is thicker than the polycrystal GaN or AlN buffer layer 103 including a low temperature amorphous crystallinity, thereby controlling the crystallinity.

The n-GaN layer 105 used as the first electrode contact layer has the characterizations of electrical conductivity, a resistance linearly decreased as the silicon doping concentration increases, and an operation voltage decreased when a forward bias is applied. On the contrary, when a reverse bias is applied, a breakdown voltage (Vbr) is decreased, so that a leakage current is increased, and as time elapses, the optical power is decreased, which badly influences the life time of the light emitting device.

Also, in adjusting the doping concentration, when the doping concentration is more than 2 μm, $10^{19}/cm^3$ (i.e., heavily doped), an extreme strain is generated to break the n-GaN layer 105. As the silicon doping concentration increases, point defects on a surface of the n-GaN layer 105 increase. Therefore, the increased point defects badly influences the active layer 107 emitting light, so that they function as a current pathway when a forward or a reverse bias is applied and function as a factor increasing the leakage current. The conventional light emitting device having the aforementioned drawbacks is subject to a limitation in the reliability.

In addition, the conventional nitride semiconductor light emitting device includes crystal defects, such as 'threading dislocation', 'screw dislocation', 'line dislocation', 'point defect', or 'mixture'. Especially, the 'threading dislocation' is propagated in the sapphire substrate to the surface of the light emitting device. During the propagation, the 'threading dislocation' passes through the active layer emitting light. Therefore, the 'threading dislocation' later serves as a current path for leakage current, and when a high voltage such as ESD or the like is instantly applied, the active layer is destroyed or the optical power is lowered. The above problems provide fundamental reasons badly influencing the device reliability.

BRIEF SUMMARY

Technical Problem

To solve the above problem, the present invention provides a nitride semiconductor light emitting device and fabrication method thereof that can enhance the crystallinity of an active layer of the nitride semiconductor light emitting device, and the optical power and reliability.

Also, the present invention provides a structure of a first electrode contact layer and fabrication method thereof.

Technical Solution

There is provided a nitride semiconductor light emitting device including: a first nitride semiconductor layer having a super lattice structure of AlGaN/n-GaN or AlGaN/GaN/n-GaN; an active layer formed above the first nitride semiconductor layer to emit light; a second nitride semiconductor layer formed above the active layer; and a third nitride semiconductor layer formed above the second nitride semiconductor layer.

In another aspect of the present invention, there is provided a method of fabricating a nitride semiconductor light emitting device, the method including: forming a first nitride semiconductor layer serving as a first electrode contact layer in a super lattice structure of AlGaN/n-GaN or AlGaN/GaN/n-GaN; forming an active layer emitting light above the first nitride semiconductor layer; and forming a second nitride semiconductor layer above the active layer.

Advantageous Effects

According to the present invention, the crystallinity of the active layer and the optical power and reliability of the light emitting device can be enhanced.

Also, a uniform and stable operation voltage can be obtained even in a relatively low silicon doping concentration by the first electrode contact layer having the super lattice structure, and especially, in a reverse bias operation, the breakdown voltage is increased and leakage current is decreased to enhance the reliability of the light emitting device.

BRIEF DESCRIPTION OF DRAWINGS

The spirit of the present invention will be understood more apparently from the accompanying drawings. In the drawings.

DETAILED DISCLOSURE

Best Mode for Carrying Out the Invention

Hereinafter, embodiments of the present invention will be described in more detail with reference to the accompanying drawings.

First Embodiment

Figure 1:
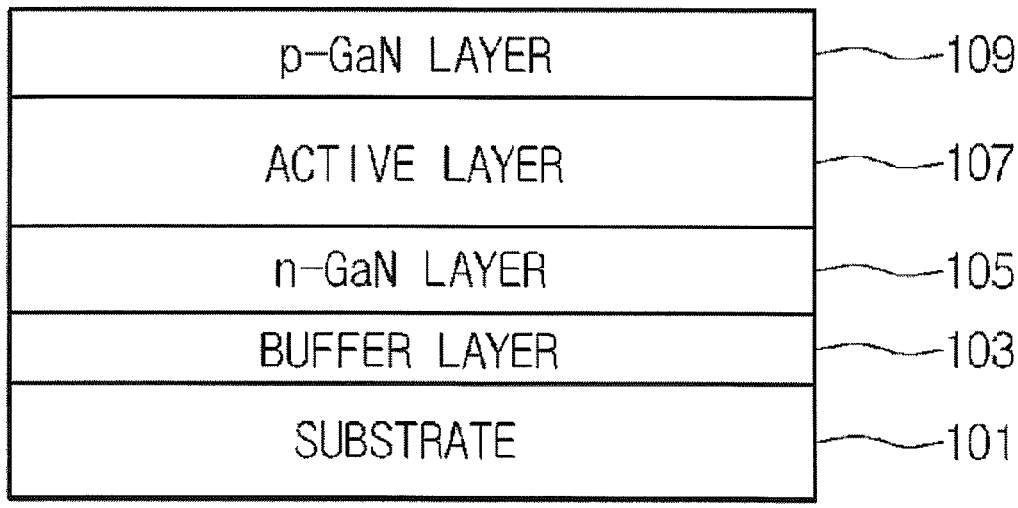
FIG. 1 is a sectional view of a general nitride semiconductor light emitting device.
Figure 2:
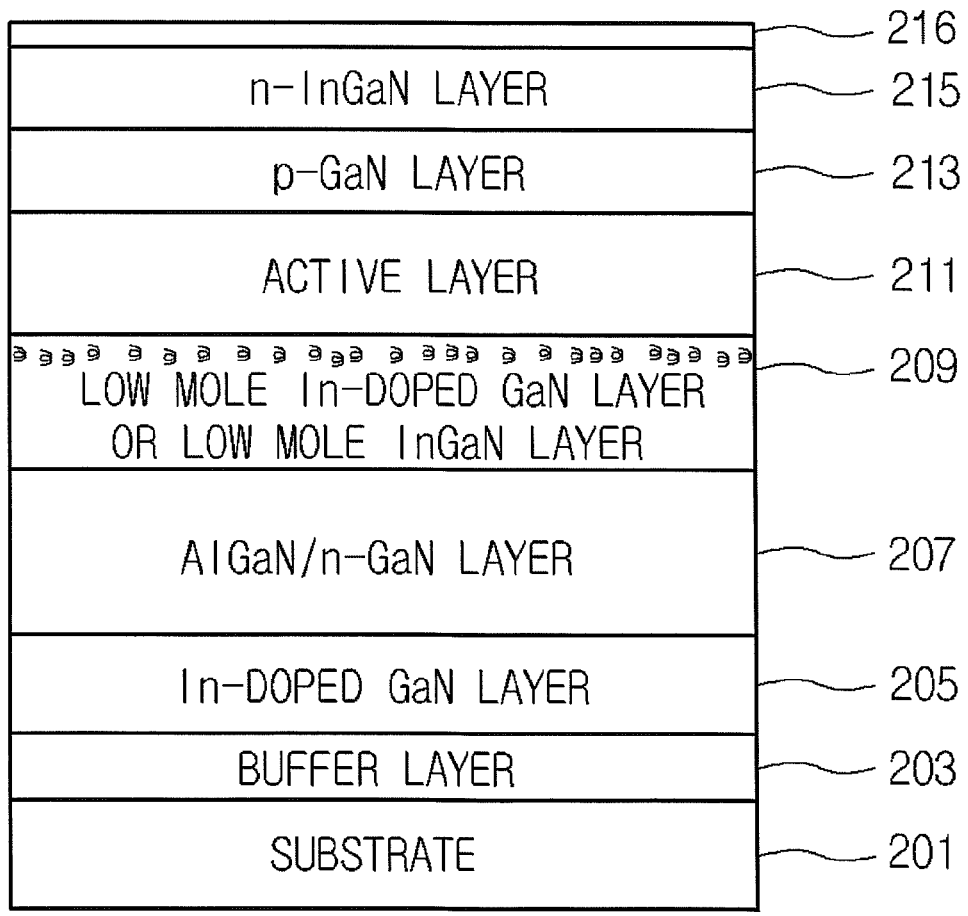
FIG. 2 is a sectional view of a stack structure of a nitride semiconductor light emitting device according to a first embodiment of the present invention.

FIG. 2 is a sectional view of a stack structure of a nitride semiconductor light emitting device according to a first embodiment of the present invention.

Referring to FIG. 2, the nitride semiconductor light emitting device according to a first embodiment of the present invention includes a substrate 201, a buffer layer 203, an In-doped GaN layer 205, an AlGaN/n-GaN super lattice layer 207, a low-mole In-doped GaN layer or low-mole InGaN layer 209, an active layer 211, a p-GaN layer 213, and an n-InGaN layer 215.

The construction of the nitride semiconductor light emitting device will now be described in more detail. The buffer layer 203 is grown on the substrate 201 at a low growth temperature of 500-600° C. Herein, the buffer layer 203 is formed in one selected from the group consisting of a stack structure of AlInN/GaN, a super lattice structure of InGaN/GaN, a stack structure of $In_xGa_{1-x}N/GaN$ and a stack structure of $Al_xIn_yGa_{1-(x+y)}N/In_xGa_{1-x}N/GaN$.

Thereafter, the buffer layer 203 is recrystallized at a high growth temperature, and at the same temperature, the In-doped GaN layer 205 is grown at a thickness of less than 2 μm. Thereafter, the AlGaN/n-GaN super lattice layer 207 used as the first electrode contact layer is grown to an overall thickness of less than 2 μm.

The AlGaN/n-GaN super lattice layer is formed in a super lattice structure including the undoped AlGaN grown to a thickness of less than 100 Å with an Al composition of 20%, and the silicon (Si)-doped n-GaN layer having a thickness of less than 300 Å. Also, the AlGaN/n-GaN super lattice layer has at least one period, each period consisting of the AlGaN layer and the n-GaN layer and formed at a thickness of less than 400 Å, and is formed at an overall thickness of less than 2 μm by repeatedly growing one period.

Additionally, the AlGaN/n-GaN super lattice layer 207 is formed such that the thickness of each of the AlGaN layer and the n-GaN layer is smaller than that of the buffer layer 203 formed at a relatively low temperature and only the n-GaN layer is doped with Si.

Further, to increase the internal quantum efficiency of the active layer 211, the low-mole In-doped GaN layer or low-mole InGaN layer 209 as a strain control layer capable of controlling the strain of the active layer 211 is grown. The low-mole In-doped GaN layer or low-mole InGaN layer 209 is grown such that the contained indium content is less than 5%. Also, the low-mole In-doped GaN layer or low-mole InGaN layer 209 is grown such that its thickness is in a range of 100-300 Å. As the active layer 211 emitting light having a desired wavelength band, a single quantum well or a multi quantum well having one period consisting of well layer/barrier layer is grown in $In_xGa_{1-x}N$ (indium content 15-35%)/an $In_yGa_{1-y}N$ (indium content less than 5%) structure. Although not shown in the drawings, a SiNx cluster layer can be further formed between the well layer and the barrier layer at an atomic level to increase the light emitting efficiency of the active layer 211.

Thereafter, the growth temperature is increased to grow the p-GaN layer 213. Thereafter, the n-InGaN layer 215 used as the second electrode contact layer is grown in a super grading structure in which the indium content is sequentially controlled.

According to the nitride semiconductor light emitting device having the above stack structure, the AlGaN/n-GaN super lattice layer 207 forms two dimensional electronic well layer (2 DEG: 2 Dimensional electron gas) on a boundary to have a uniform current flow under an applied bias. Therefore, the nitride semiconductor light emitting device of the present invention shows a uniform operating voltage (forward voltage, VF).

Also, the nitride semiconductor light emitting device of the present invention suppresses the 'threading dislocation' formed in the sapphire substrate to enhance the crystallinity.

In addition, the nitride semiconductor light emitting device of the present invention effectively performs the current spreading by the two dimensional electron well layer when an ESD (electro static discharge) high voltage of human body mode is applied from an external environment.

Meanwhile, the nitride semiconductor light emitting device of the present invention forms an n-/p-/n-junction structure. A second electrode material 216 formed on the n-InGaN layer 215 is determined by a doping phase or an energy bandgap difference of the n-InGaN layer 215. Then, as aforementioned, since the n-InGaN layer 215 has the super grading structure in which the indium content is linearly varied so as to increase the current spreading effect, the second electrode material 216 can be a transmissive oxide or a transmissive resistive metal. Examples of the second electrode material 216 include ITO, IZO(In—ZnO), GZO(Ga—ZnO), AZO(Al—ZnO), AGZO(Al—Ga ZnO), IGZO(In—Ga ZnO), $IrO_x$, $RuO_x$, $RuO_x$/ITO, Ni/$IrO_x$/Au, Ni/$IrO_x$/Au/ITO and the like.

The light emitting device having the above construction can enhance the optical power 30-50% compared with the conventional light emitting device, and it can also enhance the operation reliability of the light emitting device.

Hereinafter, an embodiment of the fabrication method of the nitride semiconductor light emitting device will be described in more detail.

First, in the present invention, only $H_2$ carrier gas is supplied onto the sapphire substrate 201 at a high temperature to clean the sapphire substrate. Thereafter, in step of decreasing the growth temperature to 540° C., $NH_3$ source gas is introduced to perform a nitridation of the sapphire substrate, for example for 7 minutes.

Thereafter, the buffer layer 203 having a $1^{st}$ AlInN/$1^{st}$ GaN/$2^{nd}$ AlInN/$2^{nd}$ GaN structure is grown to a thickness of about 500 Å. Then, the growth temperature is increased up to 1060° C. for 6 minutes, the low temperature buffer layer 203 is recrystallized in a mixture ambient of $NH_3$ source gas and $H_2$ carrier gas for 2 minutes, and at the same growth temperature, the indium-doped single crystal GaN layer 205 having about 2 μl thickness is grown.

Thereafter, the growth temperature is decreased to 1030° C., and undoped AlGaN layer having an Al composition of 10% and Si-heavily doped n-GaN layer are respectively grown to thicknesses of 50 Å and 250 Å. At this time, the Al content can be in a range of 0.05-0.3 (1 corresponds to 100%). The undoped AlGaN layer can be formed in a thickness range of 10-200 Å. Thus, the AlGaN/n-GaN super lattice structure in which one period is formed at a thickness of 300 Å includes 40 periods, and the AlGaN/n-GaN super lattice layer thereof is grown to an overall thickness of 1 μm and is used as the first electrode contact layer 207.

It is reported that the hole mobility and concentration of the first electrode contact layer having the AlGaN/n-GaN super lattice structure are respectively 450 $cm^3$/Vsec and $2 \times 10^{18}$/$cm^3$, which are 1.5-2 times higher than the n-GaN layer having the same thickness and Si doping concentration.

Also, to adjust the strain of the active layer, the low-mole In-doped GaN layer or low-mole InGaN layer 209 having 5% indium content (wavelength: 480 nm) is grown to a thickness of 100-300 Å at 750° C. The low-mole In-doped GaN layer or low-mole InGaN layer is intentionally controlled in 'spiral growth mode' having a uniform profile on the sapphire substrate. Thereafter, at the same growth temperature, the active layer 211 having a single quantum well (SQW) of undoped InGaN/InGaN structure is grown. In the grown active layer 211, the barrier layer has an indium content of less than 5% and a thickness of about 200 Å.

Thereafter, the growth temperature is increased to 1000° C. to grow the Mg-doped p-GaN layer 213 to a thickness of 1000 Å in a mixture gas ambient of $NH_3$ source gas and $N_2$ carrier gas. Thereafter, the growth temperature is again decreased to 800° C., and in a mixture gas ambient of $NH_3$ source gas and $N_2$ carrier gas, the Si-doped n-InGaN layer 215 is grown to a thickness of 50 Å. The n-InGaN layer 215 is used as the second electrode contact layer and is designed to have a super grading (SG) structure in which the indium content is controlled to thereby control the energy bandgap (Eg) profile on the whole.

A 330 μm×305 μm light emitting device is fabricated by a MESA etching of a surface to the AlGaN/n-GaN(Si) super lattice structure by 6000 Å in a SQW's npn-SG LED which uses the AlGaN/n-GaN super lattice layer 207 as the first electrode contact layer and the n-InGaN layer 215 as the second electrode contact layer, and electrical properties and reliability performance analysis such as ESD are performed and evaluated.

Figure 3:
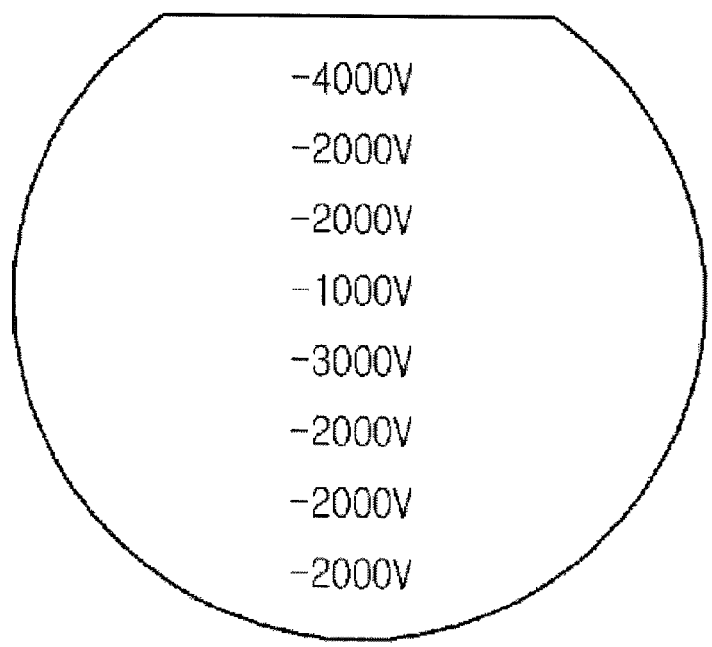
FIG. 3 is a view illustrating a reliability test result of a nitride semiconductor light emitting device according to the present invention.

FIG. 3 is a view illustrating a reliability test result of a nitride semiconductor light emitting device according to the present invention, in which ESD levels are measured not in an LED chip die state but in a wafer state with respect to the whole 2 inches sapphire substrate in Human body mode related with the reliability of an actually fabricated blue LED.

Referring to FIG. 3, it can be confirmed that in 'human body mode', the ESD levels are uniform in a range of minimum (−) 1000V to maximum (−) 4000V from a flat face of the 2 inch wafer in a round edge direction and accordingly, SQW's npn-SG LED having a uniform and excellent electrical performance is realized.

To evaluate the reliability of the ESD levels, (−) 1000 V is set as a minimum value, and then the minimum value is linearly increased by (−) 1000 V to (−) 2000V, (−) 3000V, (−) 4000V, (−) 5000V for accuracy. Also, the minimum ESD level is verified by directly applying (−) 1000 V without step-by-step voltage increase. When the step-by-step voltage is increases or the voltage of (−) 1000 V is directly applied, it is verified that a blue light emitting device maintaining minimum (−) 1000 V and having an excellent characteristic is realized. Also, under 20 mA forward bias, the operating voltage (VF) is uniformly maintained in a range of 3.3-3.4 V. When a Ni/Au transmissive electrode is applied in a wavelength of 460 nm, the optical power can be in a range of 4 mW-4.5 mW, and when an ITO transmissive oxide electrode is applied, the optical power can be in a range of 6.2 mW-6.5 mW.

The present invention is characterized in that the AlGaN/n-GaN(Si) super lattice layer which is thinner than the buffer layer formed at a low temperature is grown to an overall thickness range of 1-2 μm to be applied as the first electrode contact layer. According to the present invention, unlike in the conventional growth method, the electron mobility can be effectively increased even at a relatively low doping concentration by the two dimensional electron well layer.

Also, the AlGaN/n-GaN(Si) super lattice layer according to the present invention can perform the function as a blocking layer which suppresses the crystal defect, such as 'threading dislocation' from being propagated to a surface of the light emitting device.

Second Embodiment

Figure 4:
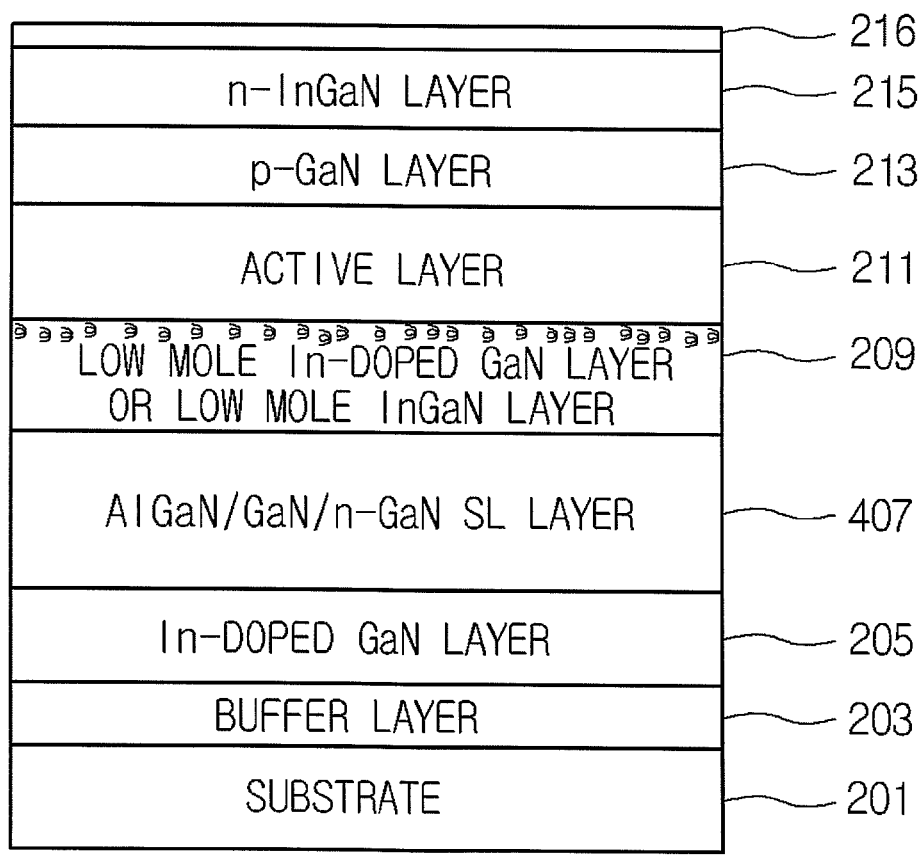
FIG. 4 is a sectional view of a stack structure of a nitride semiconductor light emitting device according to a second embodiment of the present invention.

FIG. 4 is a sectional view of a stack structure of a nitride semiconductor light emitting device according to a second embodiment of the present invention.

Referring to FIG. 4, the nitride semiconductor light emitting device according to a second embodiment of the present invention includes a substrate 201, a buffer layer 203, an In-doped GaN layer 205, an AlGaN/GaN/n-GaN super lattice layer 407, a low-mole In-doped GaN layer or low-mole InGaN layer 209, an active layer 211, a p-GaN layer 213, and an n-InGaN layer 215.

Compared with the first embodiment, the above second embodiment has a difference in the AlGaN/GaN/n-GaN super lattice layer 407, but is the same in other elements. Therefore, only the AlGaN/GaN/n-GaN super lattice layer 407 will be additively described and descriptions of other elements will be referred from that of the first embodiment.

The first electrode contact layer structure of the second embodiment is characterized in that an undoped-GaN layer having a thickness range of 10-200 Å is interposed between the AlGaN layer and the n-GaN layer doped with a large amount of silicon in the same composition and thickness so as to increase a discontinuous bandgap difference at an interface between the n-GaN layer and the AlGaN layer. More preferably, the undoped GaN layer can be formed at a thickness of less than 100 Å. By doing so, the potential of the two dimensional electron well layer can be further increased.

Only, an increase in the operating voltage may be caused by the undoped GaN layer having the thickness of less than 100 Å and contained in the first electrode contact layer. This is because the Si-doped fixed n-GaN layer is as thin as 250 Å to decrease the silicon doping efficiency. To solve the above problem, there can be provided a growth method of increasing the silicon doping concentration of the n-GaN layer or increasing the thickness of the n-GaN layer within a range of 300-500 Å. At this time, the Si doping concentration in the n-GaN layer can be in a range of $1 \times 10^{18}/cm^3$-$5 \times 10^{18}/cm^3$.

INDUSTRIAL APPLICABILITY

According to the nitride semiconductor light emitting device and fabrication method thereof provided by the present invention, the crystallinity of the active layer is enhanced, and the optical power and the operation reliability are enhanced.

In detail, in the conventional nitride semiconductor light emitting device, when the n-GaN layer serving as the first electrode contact layer is heavily doped with impurities at a doping concentration of more than $1 \times 10^{19}/cm^3$ at a thickness of less than 6 μm, the silicon doping concentration is linearly increased depending on the injection flow rate of a doping source, for example, $SiH_4$ or $Si_2H_6$. Therefore, when the thickness of the n-GaN layer is increased more than 2 μm, it is subject to an enormous amount of strain, so that crack may be generated in the n-GaN layer. Also, as the silicon concentration of the n-GaN layer increases, the roughness, shape and stress of the surface become different. Therefore, the active layer formed on the n-GaN layer is influenced by the above factor, so that the optical power is decreased.

However, according to the nitride semiconductor light emitting device of the present invention, since the AlGaN/GaN super lattice layer is formed as the first electrode contact layer, even when one period of the AlGaN layer and the GaN layer is within a thickness range of 250-500 Å and the two layers constituting one period are repeatedly grown at an overall thickness of 1-2 μm, the reliability can be secured.

Also, the AlGaN/GaN super lattice layer employed in the nitride semiconductor light emitting device of the present invention can obtain a low electron mobility and a uniform current spreading using a relatively low doping concentration and the effect of a two dimensional electron well layer, and can also function as a blocking layer that can relatively suppress the crystal defect propagating from the substrate to a surface of the light emitting device in a middle path to change the progress direction.

In addition, according to the nitride semiconductor light emitting device of the present invention, a transmissive oxide such as ITO can be applied to maximize the optical power by the excellent current spreading and transmission characteristic, and a ZnO-based material having more excellent thermal, structural and electrical characteristics than the ITO transmissive oxide, such as IZO(In—ZnO), GZO(Ga—ZnO), AZO (Al—ZnO), IGZO(In—Ga ZnO), AGZO(Al—Ga ZnO) and the like can be applied to further enhance the optical power and the operation reliability.

What is claimed is:

1. A nitride semiconductor light emitting device comprising:
    a first nitride semiconductor layer having a super lattice structure of AlGaN/GaN or AlGaN/undoped-GaN/GaN;
    an active layer formed above the first nitride semiconductor layer to emit light;
    a second nitride semiconductor layer formed above the active layer;
    a third nitride semiconductor layer formed above the second nitride semiconductor layer; and
    a low mole indium-containing nitride layer formed between the first nitride semiconductor layer and the active layer,
    wherein the low mole indium-containing nitride layer has a spiral shape and a thickness in a range of 100-300 Å.

2. The nitride semiconductor light emitting device according to claim 1, wherein the third nitride semiconductor layer is provided as a second electrode contact layer of an n-InGaN to form a junction structure of n-/p-/n-.

3. The nitride semiconductor light emitting device according to claim 1, further comprising:
    a substrate; and
    a buffer layer formed above the substrate;
    wherein the substrate and the buffer layer are formed below the first nitride semiconductor layer.

4. The nitride semiconductor light emitting device according to claim 3, further comprising an indium-doped nitride semiconductor layer formed above the buffer layer.

5. The nitride semiconductor light emitting device according to claim 3, wherein the buffer layer has a structure selected from the group consisting of a stack structure of AlInN/GaN, a super lattice structure of InGaN/GaN, a stack structure of $In_xGa_{1-x}N$/GaN, and a stack structure of $Al_xIn_yGa_{1-(x+y)}N$/$In_xGa_{1-x}N$/GaN.

6. The nitride semiconductor light emitting device according to claim 3, wherein the first nitride semiconductor layer has a higher growth temperature than that of the buffer layer.

7. A nitride semiconductor light emitting device comprising:
    a first nitride semiconductor layer having a super lattice structure of AlGaN/GaN or AlGaN/undoped-GaN/GaN;
    an active layer formed above the first nitride semiconductor layer to emit light;
    a second nitride semiconductor layer formed above the active layer;
    a third nitride semiconductor layer formed above the second nitride semiconductor layer; and
    a low mole indium-containing nitride layer formed between the first nitride semiconductor layer and the active layer,
    wherein the low mole indium-containing nitride layer has a spiral shape;
    wherein the super lattice structure of AlGaN/GaN constituting the first nitride semiconductor layer has one periodic thickness in a range of 250-500 Å; and
    wherein the super lattice structure of AlGaN/undoped-GaN/GaN constituting the first nitride semiconductor layer has one periodic thickness in a range of 300-550 Å.

8. The nitride semiconductor light emitting device according to claim 1, wherein the first nitride semiconductor layer has an overall thickness range of 1-2 μm.

9. The nitride semiconductor light emitting device according to claim 1, wherein the AlGaN layer constituting the first nitride semiconductor layer is a undoped layer and has an Al composition of 5%-30%.

10. The nitride semiconductor light emitting device according to claim 1, wherein the AlGaN layer constituting the first nitride semiconductor layer is formed in a thickness range of 10-200 Å.

11. The nitride semiconductor light emitting device according to claim 1, wherein the second nitride semiconductor layer is a p-type nitride semiconductor layer.

12. The nitride semiconductor light emitting device according to claim 1, wherein the undoped-GaN layer constituting the first nitride semiconductor layer is formed in a thickness range of 10-200 Å.

13. The nitride semiconductor light emitting device according to claim 1, wherein the n-GaN layer constituting the first nitride semiconductor layer is doped with silicon, or silicon and indium.

14. The nitride semiconductor light emitting device according to claim 1, wherein the n-GaN layer constituting the first nitride semiconductor layer is formed in a thickness range of 200-500 Å.

15. The nitride semiconductor light emitting device according to claim 1, wherein the GaN layer constituting the first nitride semiconductor layer has a doping concentration range of $1 \times 10^{18}/cm^3$-$5 \times 10^{18}/cm^3$.

16. The nitride semiconductor light emitting device according to claim 1, wherein the low mole indium-containing nitride layer has an indium content of 1-5%.

17. The nitride semiconductor light emitting device according to claim 1, wherein the active layer is formed in a single quantum well layer or a multi quantum well layer comprised of a well layer and a barrier layer, and an SiNx cluster layer is further formed between the well layer and the barrier layer.

18. The nitride semiconductor light emitting device according to claim 1, wherein the third nitride semiconductor layer is formed of an n-InGaN layer with an SG (super grading) structure in which indium content is gradually varied.

19. The nitride semiconductor light emitting device according to claim 1, further comprising a transparent electrode formed above the third nitride semiconductor layer.

20. The nitride semiconductor light emitting device according to claim 19, wherein the transparent electrode is formed of one selected from the group consisting of ITO, IZO(In—ZnO), GZO(Ga—ZnO), AZO(Al—ZnO), AGZO (Al—Ga ZnO), IGZO(In—Ga ZnO), $IrO_x$, $RuO_x$, $RuO_x$/ITO, Ni/$IrO_x$/Au, and Ni/$IrO_x$/Au/ITO.

21. A method of fabricating a nitride semiconductor light emitting device, the method comprising:
 forming a first nitride semiconductor layer serving as a first electrode contact layer in a super lattice structure of AlGaN/GaN or AlGaN/undoped-GaN/GaN;
 forming a low mole indium-containing nitride layer on the first nitride semiconductor layer;
 forming an active layer emitting light above the first nitride semiconductor layer; and
 forming a second nitride semiconductor layer above the active layer;
 wherein the low mole indium-containing nitride layer has a spiral shape.

22. The method according to claim 21, further comprising forming a third nitride semiconductor layer above the second nitride semiconductor layer,
 wherein the third nitride semiconductor layer is formed of an n-InGaN layer with an SG (super grading) structure in which indium content is gradually varied.

23. The method according to claim 21, wherein the first nitride semiconductor layer has an overall thickness range of 1-2 µm.

24. The method according to claim 21, wherein the AlGaN layer constituting the first nitride semiconductor layer is a undoped layer and is formed in a thickness range of 10-200 Å with an Al composition of 5%-30%.

25. The method according to claim 21, wherein the undoped-GaN layer constituting the first nitride semiconductor layer is formed in a thickness range of 10-200 Å.

26. The method according to claim 21, wherein the GaN layer constituting the first nitride semiconductor layer has a doping concentration range of $1 \times 10^{18}/cm^3$-$5 \times 10^{18}/cm^3$.

27. The method according to claim 21, wherein the low mole indium-containing nitride layer has an indium content of 1-5%.

28. The method according to claim 21, wherein the active layer is formed in a single quantum well layer or a multi-quantum well layer comprising a well layer and a barrier layer, further comprising forming an SiNx cluster layer between the well layer and the barrier layer.

29. The nitride semiconductor light emitting device according to claim 7, wherein the active layer is formed in a single quantum well layer or a multi-quantum well layer comprising a well layer and a barrier layer, and an SiNx cluster layer is further formed between the well layer and the barrier layer.

30. The nitride semiconductor light emitting device according to claim 7, wherein the low mole indium-containing nitride layer has a thickness in a range of 100-300 Å.

31. The method according to claim 21, wherein the low mole indium-containing nitride layer has a thickness in a range of 100-300 Å.

* * * * *